United States Patent
Chang et al.

(10) Patent No.: US 10,119,561 B1
(45) Date of Patent: Nov. 6, 2018

(54) LATCH MODULE AND DETACHABLE ASSEMBLING STRUCTURE USING SAME

(71) Applicant: DELTA ELECTRONICS, INC., Taoyuan (TW)

(72) Inventors: Chii-How Chang, Taoyuan (TW); Yao-Ju Peng, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 15/854,086

(22) Filed: Dec. 26, 2017

(30) Foreign Application Priority Data

Nov. 28, 2017 (CN) .......................... 2017 1 1215134

(51) Int. Cl.
*F16B 2/10* (2006.01)
*F16B 1/02* (2006.01)

(52) U.S. Cl.
CPC . *F16B 2/10* (2013.01); *F16B 1/02* (2013.01)

(58) Field of Classification Search
None
See application file for complete search history.

(56) References Cited

U.S. PATENT DOCUMENTS

| | | | | |
|---|---|---|---|---|
| 5,262,923 A * | 11/1993 | Batta | G06F 1/184 | 312/333 |
| 5,734,557 A * | 3/1998 | McAnally | G11B 33/124 | 361/679.58 |
| 5,971,780 A * | 10/1999 | Youn | G06F 1/1616 | 361/747 |
| 6,252,765 B1 * | 6/2001 | Balzaretti | G06F 1/184 | 361/679.42 |
| 6,373,707 B1 * | 4/2002 | Hutchins | G06F 1/183 | 211/41.17 |
| 6,392,879 B1 * | 5/2002 | Chien | G11B 33/124 | 312/223.1 |
| 6,456,495 B1 * | 9/2002 | Wieloch | H05K 7/1468 | 312/215 |
| 6,456,501 B1 * | 9/2002 | Rubenstein | G11B 33/128 | 211/41.17 |
| 6,771,496 B1 * | 8/2004 | Wu | G06F 1/184 | 108/109 |
| 7,230,833 B1 * | 6/2007 | Sickels | B60R 16/0239 | 361/740 |
| 7,604,308 B2 * | 10/2009 | Tseng | A47B 88/493 | 312/333 |

(Continued)

*Primary Examiner* — Dimary S Lopez Cruz
(74) *Attorney, Agent, or Firm* — Kirton McConkie; Evan R. Witt (57) ABSTRACT

A latch module includes a fixing member and a sliding member. A first surface of the fixing member is configured to align and engage with a mounting surface of a detachable device. A sliding unit of the sliding member is relative to a guiding unit of the fixing member and allows the sliding member to slide linearly with respect to the fixing member. The sliding member includes a pushing portion corresponding to a switching column on a resilient arm of the fixing member. While the sliding member is slid to a first position, the switching column is away from the pushing portion and a convex portion of the resilient arm tends to push against the mounting surface. While the sliding member is slid to a second position, the pushing portion pushes the switching column to drive the convex portion away from the mounting surface.

20 Claims, 10 Drawing Sheets

(56) References Cited

U.S. PATENT DOCUMENTS

| | | | | |
|---|---|---|---|---|
| 8,317,278 | B2* | 11/2012 | Enos | A47B 88/493 |
| | | | | 312/333 |
| 9,480,183 | B2* | 10/2016 | Chen | H05K 7/1489 |
| 2005/0029913 | A1* | 2/2005 | He | A47B 88/427 |
| | | | | 312/334.44 |
| 2009/0129033 | A1* | 5/2009 | Smrha | H04Q 1/142 |
| | | | | 361/732 |

* cited by examiner

LATCH MODULE AND DETACHABLE ASSEMBLING STRUCTURE USING SAME

FIELD OF THE INVENTION

The present invention relates to a detachable assembling structure, and more particularly to a latch module and a detachable assembling structure using the same.

BACKGROUND OF THE INVENTION

With the development of electronic apparatuses, an electronic apparatus is often integrated with a lot of functional electronic devices. However, in order to maintain the modularisability of the electronic apparatus, the functional electronic devices are detachable or replaceable, and further disposed in a receiving slot of the main housing.

Traditionally, the electronic devices are fixed on the frame in the housing via screws. While the stability of the entire system and the convenience of repair or replacement are considered simultaneously, a design with the detachable housing is mostly employed to facilitate to repair or replace the electronic devices accommodated inside the housing. However, these types of electronic devices must be fixed by a plurality of screws to prevent the electronic device from being loosened or detached in the housing. Furthermore, for assembling or disassembling, the electronic devices must be assembled or disassembled by using a screwdriver or a wrench. It makes the assembling or disassembling process time-consuming and laborious.

Currently, in order to facilitate the assembly or disassembly of the electronic devices therein, some electronic apparatus use a rotating handle to drive the locking mechanism of the latch to detachably fasten the electronic devices on the electronic apparatus. However, when such a locking mechanism is constructed in the housing of the electronic apparatus, a corresponding operating space must be provided for the rotating handle to assemble or disassemble the electronic devices. It is not conducive to the miniaturization of the overall structure. In addition, the rotating handle may collide with other external parts during operation, and the rotating handle is more likely to be broken or damaged due to the collision. Thus, the function of locking the electronic devices cannot be achieved.

Therefore, there is a need of providing a latch module and a detachable assembling structure using the same to overcome the above drawbacks.

SUMMARY OF THE INVENTION

An object of the present invention is to provide a latch module and a detachable assembling structure. By installing the two-piece latch module in a detachable assembly structure having a detachable electronic device, the installation, positioning, latching, unlatching and disassembling operations of the detachable electronic device are achieved at different relative positions in a linear sliding displacement of the two-piece latch module. Since the latch module adopts a linear sliding operation, its structure is simplified, the operation is easy, and the miniaturization of the overall structure is facilitated.

Another object of the present invention is to provide a latch module and a detachable assembling structure. Through the linear displacement of the two-piece latch module, the detachable electronic device can be mounted on the main structure, and the functions of the positioning and fastening can be achieved. Consequently, it prevents the detachable electronic device from breaking away the main structure due to the accidental collision, and ensures the firm connection between the detachable electronic device and the main structure.

In accordance with an aspect of the present invention, a latch module is provided. The latch module includes a fixing member and a sliding member. The fixing member includes a first surface, a second surface, an opening, a resilient arm and a guiding unit. The first surface and the second surface are opposite to each other, and the first surface is configured to align and attach to a mounting surface of a detachable device. The opening passes through the first surface and the second surface. The resilient arm is received within the opening and includes a first end connected with an edge of the opening and a second end opposite to the first end. The resilient arm includes a convex portion and at least one switching column. The convex portion is disposed on the second end of the resilient arm, located at a first side of the opening and protrudes along a direction from the second surface to the first surface. While the mounting surface is attached to the first surface, the convex portion tends to push against the mounting surface. The at least one switching column is relative to the convex portion and located at a second side of the opening. The guiding unit is disposed on two lateral sides of the fixing member. The sliding member includes at least one pushing portion and a sliding unit. The sliding unit is disposed on two lateral sides of the sliding member and configured with and relative to the guiding unit of the fixing member so that the sliding member slides linearly with respect to the fixing member along a first direction or a second direction. The first direction and the second direction are opposite to each other. While the sliding member is in a first position relative to the fixing member, the at least one switching column is separated from an end of the at least one pushing portion and the resilient arm maintains an elastic force. While the sliding member is in a second position relative to the fixing member, the at least one pushing portion pushes against the at least one switching column to drive the at least one switching column away from the second surface and drive the convex portion of the resilient arm away from the first surface along a direction from the first surface to the second surface.

In accordance with another aspect of the present invention, a detachable assembling structure is provided. The detachable assembling structure includes a housing, at least one detachable device and a latch module. The housing includes at least one lateral side, at least one receiving slot and at least one receiving opening. The detachable device is configured to be detachably received within the receiving slot along a first direction through the receiving opening, or separated from the receiving slot along a second direction through the receiving opening. The first direction and the second direction are opposite to each other. The detachable device includes at least one mounting surface and at least one recess, and the recess is disposed on the mounting surface. The latch module passes through the lateral side of the housing and includes a fixing member and a sliding member. The fixing member includes a first surface, a second surface, an opening, a resilient arm and a guiding unit. The first surface and the second surface are opposite to each other, and the first surface is communicated with the receiving slot. While the detachable device is received within the receiving slot, the first surface and the mounting surface are attached to each other. The opening passes through the first surface and the second surface, and the resilient arm is received within the opening and includes a first end connected with an edge of the opening and a second end opposite to the first end. The resilient arm includes a convex portion and at least one switching column. The convex portion is disposed on the second end of the resilient arm, located at a first side of the opening and protrudes along a direction from the second surface to the first surface. While the mounting surface is attached to the first surface, the convex portion tends to push against the mounting surface. The at least one switching column is relative to the convex portion and located at a second side of the opening. The guiding unit is disposed on two lateral sides of the fixing member. The sliding member includes at least one pushing portion and a sliding unit. The sliding unit is disposed on two lateral sides of the sliding member and configured with and relative to the guiding unit of the fixing member so that the sliding member slides linearly with respect to the fixing member along a first direction or a second direction. While the sliding member is in a first position relative to the fixing member, the at least one switching column is separated from an end of the at least one pushing portion and the resilient arm maintains an elastic force. While the sliding member is in a second position relative to the fixing member, the at least one pushing portion pushes against the at least one switching column to drive the at least one switching column away from the second surface and drive the convex portion of the resilient arm away the first surface along a direction from the first surface to the second surface.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
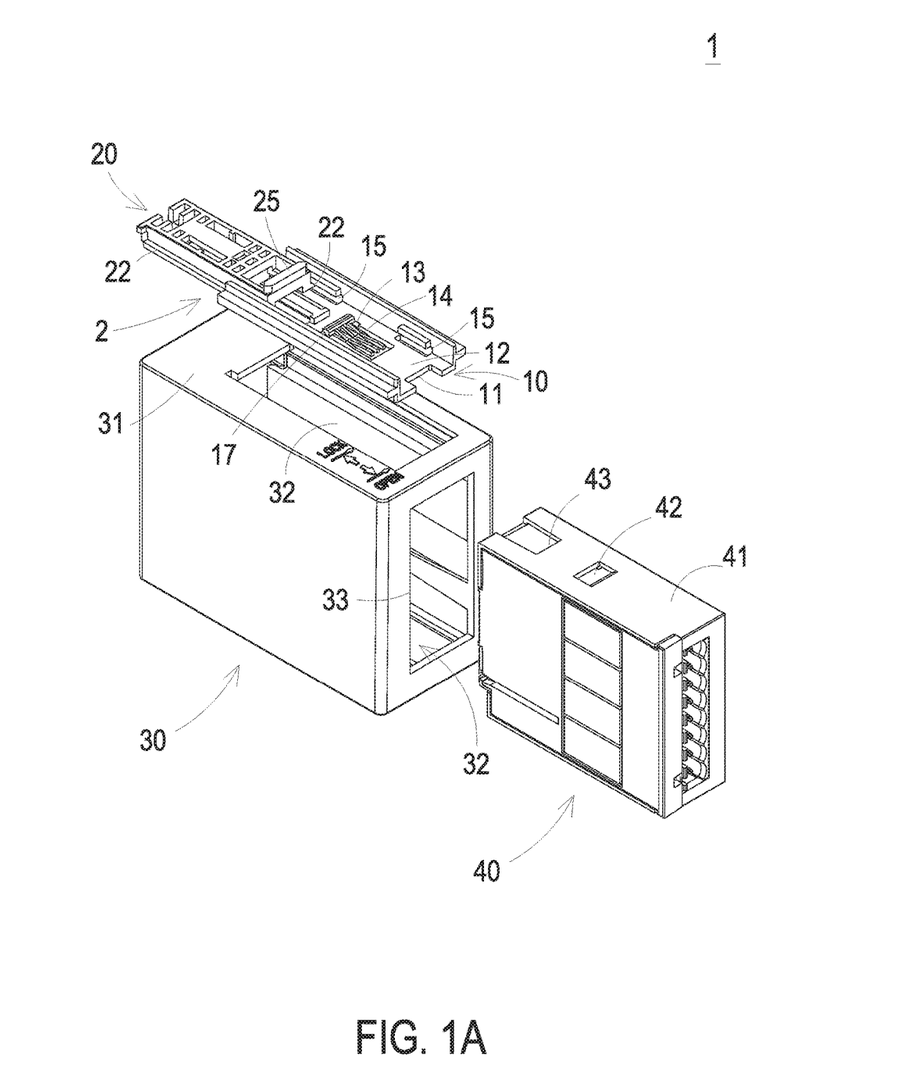
FIG. 1A is an exploded structural view illustrating a detachable assembling structure having a latch module according to a first preferred embodiment of the present invention.
Figure 1B:
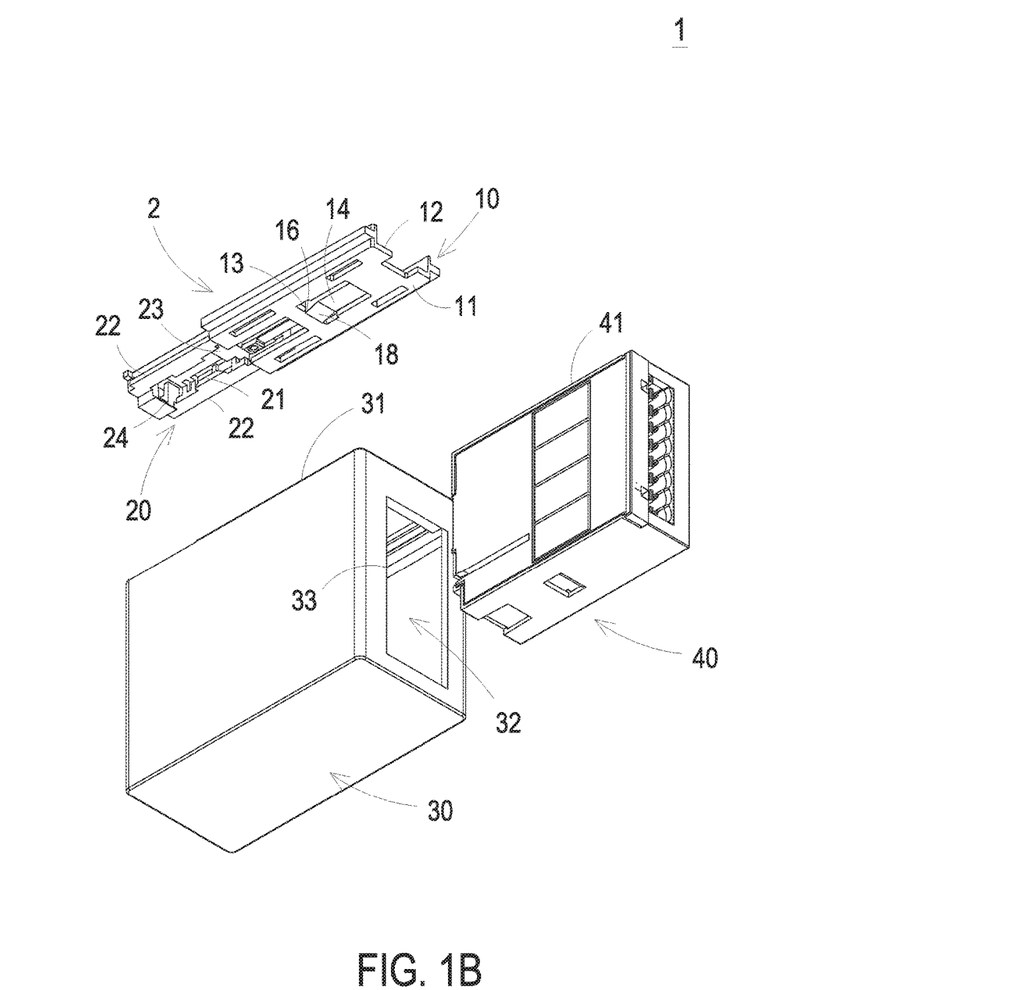
FIG. 1B is another explode structural view illustrating the detachable assembling structure having the latch module according to the first preferred embodiment of the present invention in a different perspective angle.

FIGS. 1A and 1B are exploded structural views illustrating a detachable assembling structure having a latch module according to a first preferred embodiment of the present invention in a different perspective angles. In the embodiment, the detachable assembling structure 1 includes a housing 30, at least one detachable device 40 and a latch module 2. The housing 30 can be for example but not limited to a housing of an electronic apparatus and includes at least one lateral side 31, at least one receiving slot 32 and at least one receiving opening 33. The receiving slot 32 is communicated with the receiving opening 33 and configured to receive the detachable device 40. In the embodiment, the detachable device 40 is detachably received in the receiving slot 32 through the receiving opening 33 along a first direction, which can for example but not limited to the vertical direction relative to the receiving opening 33. In the embodiment, the detachable device 40 can be for example but not limited to a circuit or information connection device, which connects a desired circuit or information cable (not shown) to an electronic device (not shown) in the housing 30 according to the practical requirements. When the electronic device in the housing 30 has to be replaced or updated to connect with another circuit or information cable, the detachable device 40 can be detached from the receiving slot 32 through the receiving opening 33 along a second direction, which is opposite to the first direction. Consequently, the detachable device 40 is disassembled from the housing 30. On the other hand, while the detachable device 40 is detachably received in the receiving slot 32 of the housing 30, in order to ensure that the detachable device 40 is effectively connected with the electronic device in the housing 30 and prevent the detachable device 40 from breaking away the receiving slot 32 of the housing 30 due to the accidental collision of the circuit or information cable, the detachable assembling structure 1 further has the latch module 2 disposed on the lateral side 31 of the housing 30 for providing the functions of positioning and fastening.

Figure 2A:
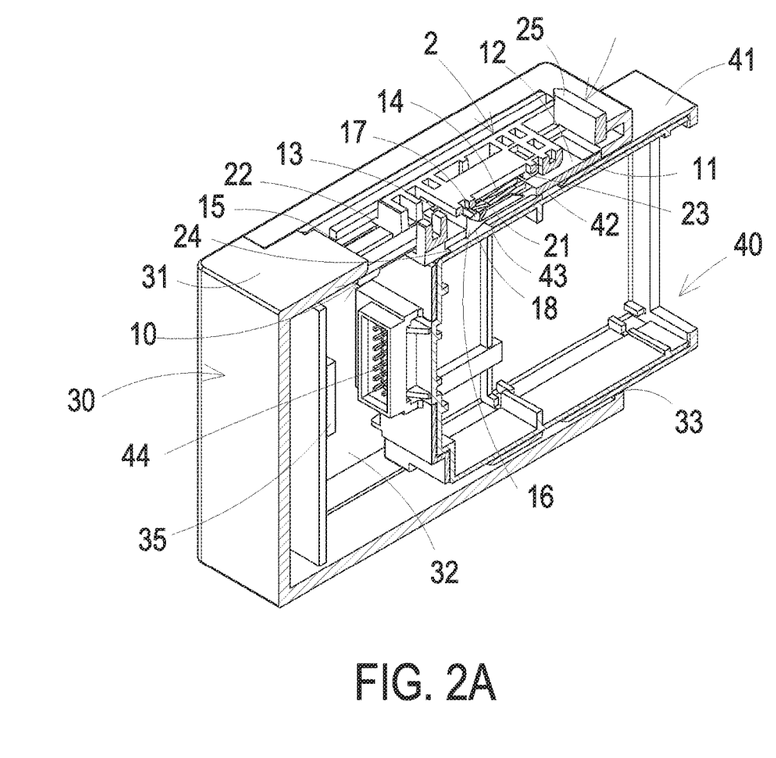
FIG. 2A is a schematic view illustrating the latch module of the detachable assembling structure of FIG. 1A in a first position.
Figure 2B:
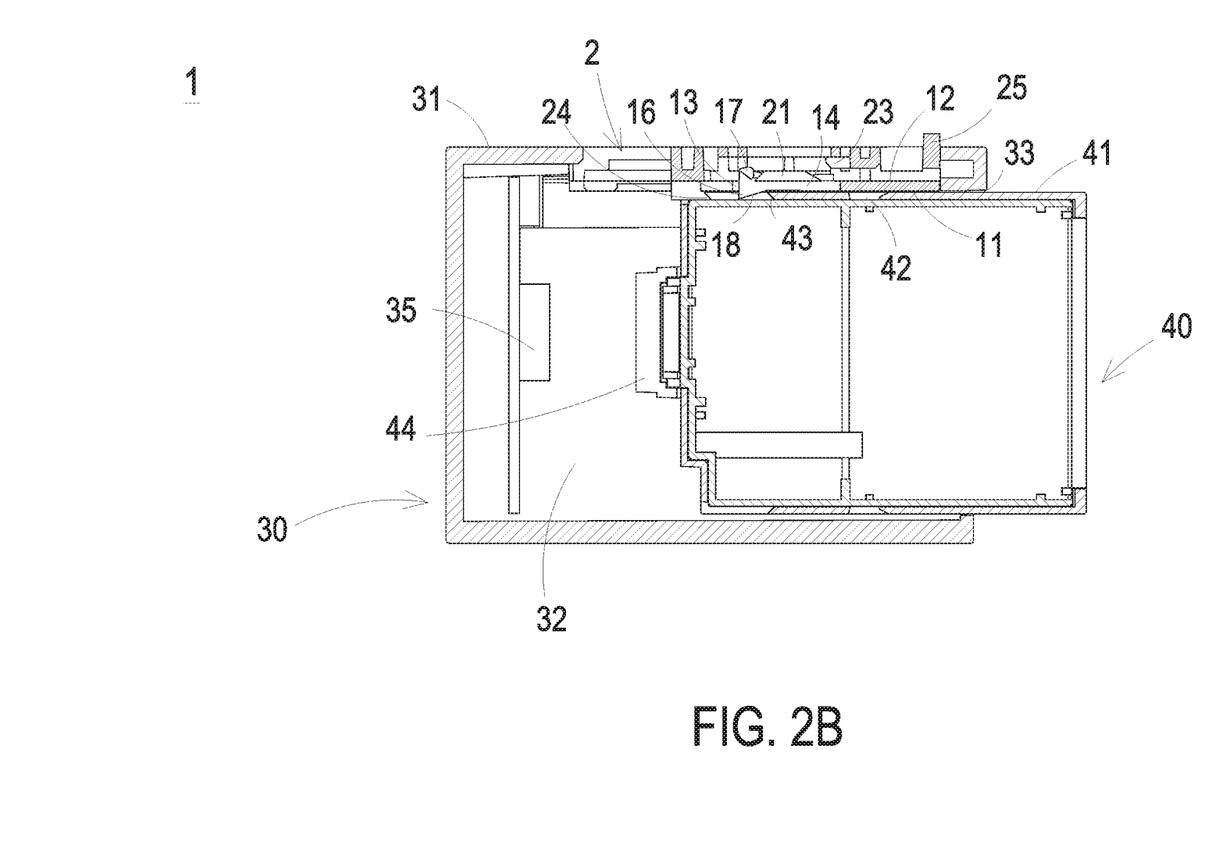
FIG. 2B shows a side view of FIG. 2A.
Figure 3A:
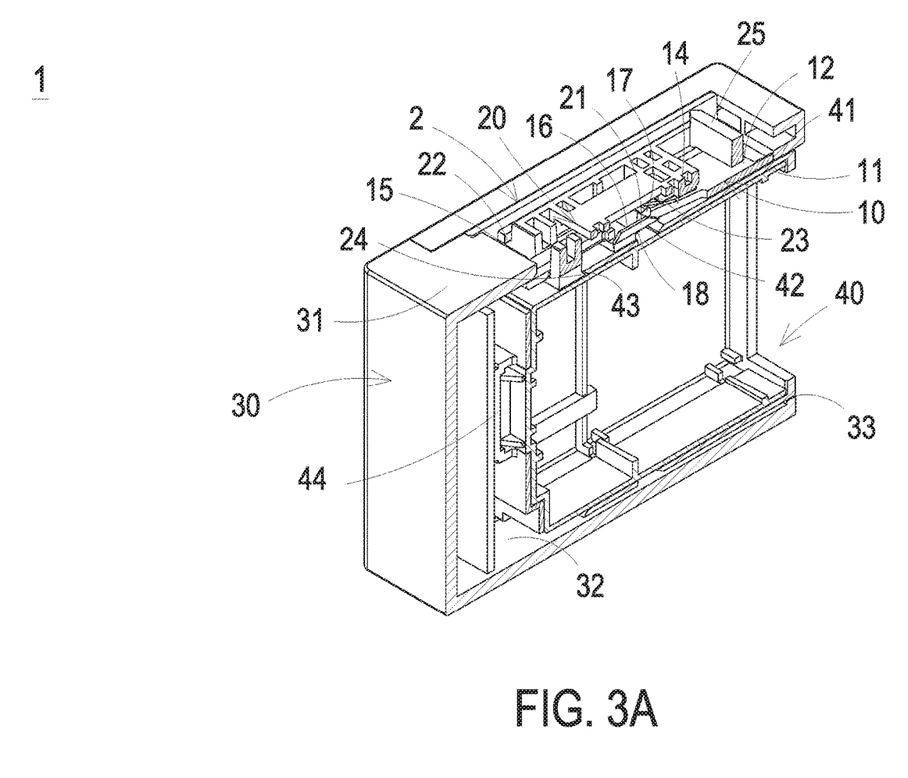
FIG. 3A is a schematic view illustrating the latch module of the detachable assembling structure of FIG. 1A in a second position.
Figure 3B:
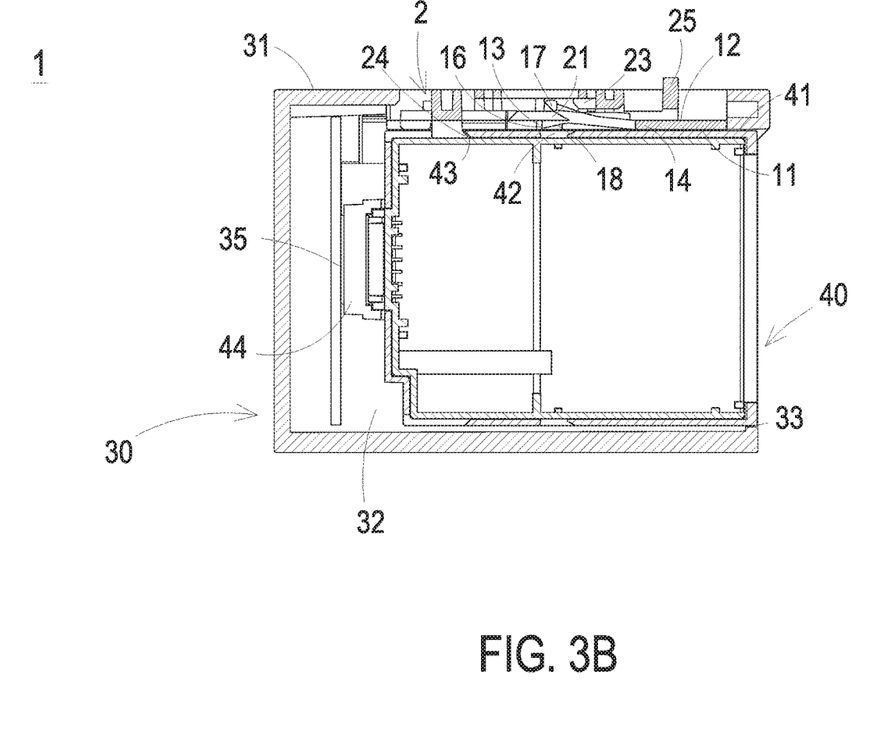
FIG. 3B shows a side view of FIG. 3A.
Figure 4A:
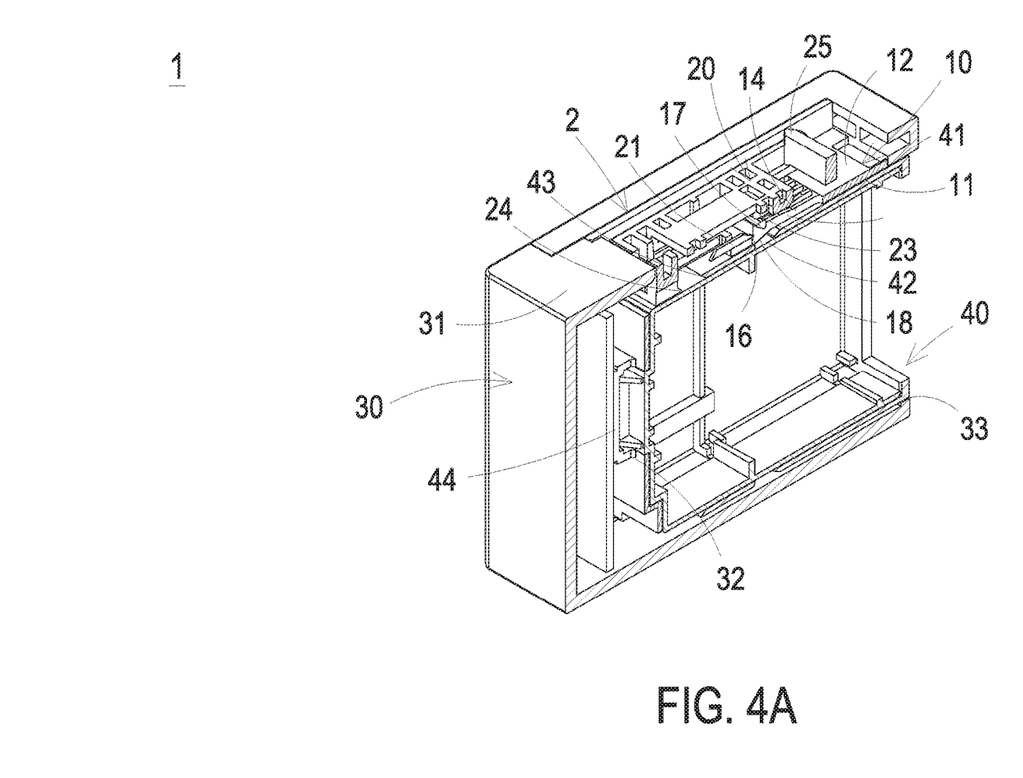
FIG. 4A is a schematic view illustrating the latch module of the detachable assembling structure of FIG. 1A in a third position.
Figure 4B:
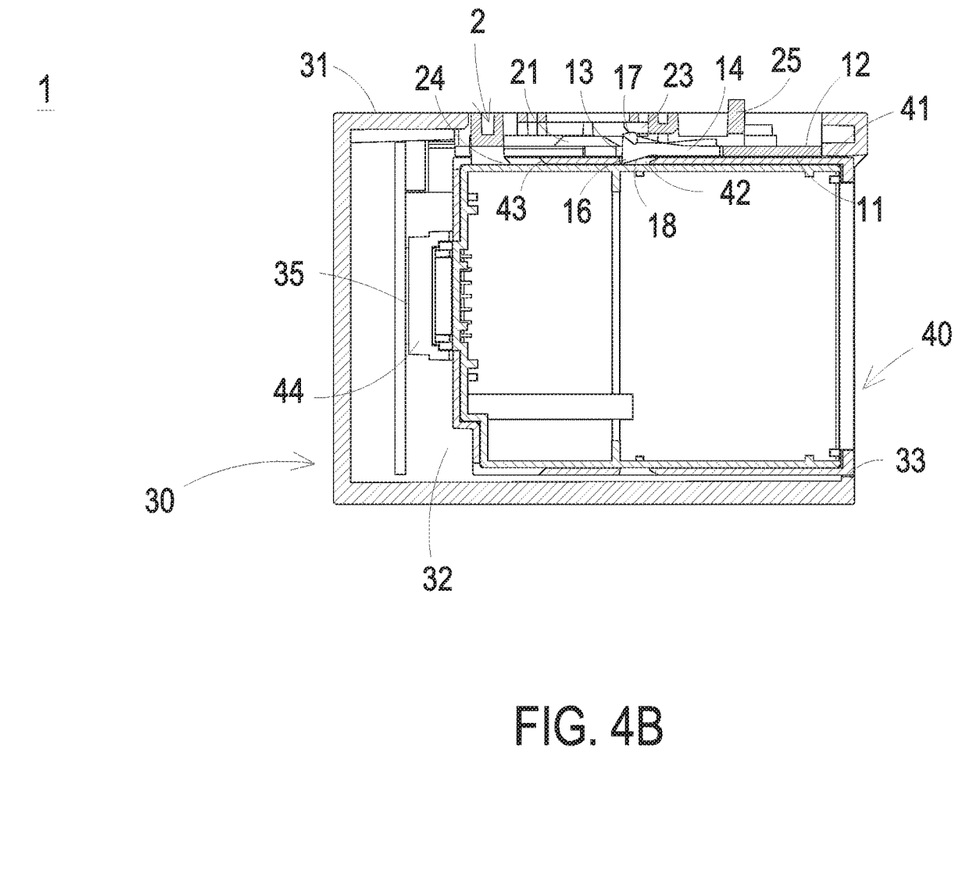
FIG. 4B shows a side view of FIG. 4A.

In the embodiment, the latch module 2 passes through the lateral side 31 of the housing 30 and is communicated with the receiving slot 32, so as to achieve the effects of positioning and fastening while the detachable device 40 is received within the receiving slot 32. The detachable device 40 includes at least one mounting surface 41 and at least one recess 42 and is configured with the linear displacement of the latch module 2 in different positions. FIG. 2A is a schematic view illustrating the latch module of the detachable assembling structure of FIG. 1A in a first position. FIG. 2B shows a side view of FIG. 2A. FIG. 3A is a schematic view illustrating the latch module of the detachable assembling structure of FIG. 1A in a second position. FIG. 3B shows a side view of FIG. 3A. FIG. 4A is a schematic view illustrating the latch module of the detachable assembling structure of FIG. 1A in a third position. FIG. 4B shows a side view of FIG. 4A. As shown in FIGS. 1A-1B, 2A-2B, 3A-3B and 4A-4B, the latch module 2 can be for example but not limited to two-piece form, and includes a fixing member 10 and a sliding member 20. The fixing member 10 passes through and disposed within the lateral side 31 of the housing 30, and includes a first surface 11, a second surface 12, an opening 13, a resilient arm 14 and a guiding unit 15. The first surface 11 and the second surface 12 are opposite to each other and the first surface 11 is communicated with the receiving slot 32. While the detachable device 40 is received within the receiving slot 32 of the housing 30, the first surface 11 is aligned and attached to the mounting surface 41 of the detachable device 40. In the embodiment, the opening 13 passes through the first surface 11 and the second surface 12. The resilient arm 14 is received within the opening 13 and includes a first end connected with an edge of the opening 13 and a second end opposite to the first end. Furthermore, the resilient arm 14 can be extended for example from the edge of the opening 13 along the first direction to be received within the opening 13. In the embodiment, the resilient arm 14 includes a convex portion 16 and at least one switching column 17. The convex portion 16 is disposed on the second end of the resilient arm 14, located at a first side of the opening 13 and protrudes along a direction from the second surface 12 to the first surface 11. Since the resilient arm 14 maintains an elastic force within the opening 13 and the convex portion 16 of the resilient arm 14 is partially protruded through the first surface 11, the convex portion 16 of the resilient arm 14 tends to push against the mounting surface 41 of the detachable device 40, while the detachable device 40 is received within the receiving slot 32 and the mounting surface 41 is attached to the first surface 11. It facilities to achieve the effects of positioning and fastening. In addition, the switching columns 17 of the resilient arm 14 are relative to the convex portion 16 and located at a second side of the opening 13. In the embodiment, the switching columns 17 are for example two protruding columns disposed on two lateral sides of the resilient arm 14. The guiding unit 15 is disposed on two lateral sides of the fixing member 10.

In the embodiment, the sliding member 20 is corresponding to the structure of the fixing member 10 and includes at least one pushing portion 21 and a sliding unit 22. The at least one pushing portion 21 is relative to the at least one switching column 17. In the embodiment, the at least one pushing portion 21 can be for example but not limited to two protruding rails and relative to the two switching columns 17 of the resilient arm 14. Furthermore, the sliding unit 22 of the sliding member 20 is relative to the guiding unit 15 of the fixing member 10 and disposed on two lateral sides of the sliding member 20. Thus, the sliding member 20 is configured to slide linearly with respect to the fixing member 10 along the first direction or the opposite second direction. In the embodiment, the guiding unit 15 and the sliding unit 22 are a concave rail and a convex rail, respectively, and relative to each other. It is emphasized that the combination of the guiding unit 15 and the sliding unit 22 is not limited to the above embodiment. Any combination of the guiding unit 15 and the sliding unit 16 that can make the sliding member 20 linearly displace relative to the fixing member 10 can be applied to the present invention, and not redundantly described herein.

In the embodiment, while the sliding member 20 is in a first position relative to the fixing member 10, the switching columns 17 are separated from the ends of the pushing portions 21 and free of contacting with or pushing against each other. The resilient arm 14 maintains the elastic force. The exemplary status of the first position is shown in FIGS. 2A and 2B. Furthermore, while the sliding member 20 is in a second position relative to the fixing member 10, the pushing portions 21 push against the switching columns 17 and drives the switching columns 17 away from the second surface 12. The convex portion 16 of the resilient arm 14 is driven away from the first surface 11 along the direction from the first surface 11 to the second surface 12. Thus, the convex portion 16 of the resilient arm 14 doesn't pass through the first surface 11. While the first surface 11 is attached to the mounting surface 41, the convex portion 16 of the resilient arm 14 doesn't contact or push against the mounting surface 41 of the detachable device 40. The exemplary status of the second position is shown in FIGS. 3A and 3B. On the other hand, while the sliding member 20 is in a third position relative to the fixing member 10, the mounting surface 41 of the detachable device 40 is aligned and attached to the first surface 11 of the fixing member 10, and the convex portion 16 of the resilient arm 14 is relative to the recess 42 on the mounting surface 41. The exemplary status of the third position is shown in FIGS. 4A and 4B. Thus, the convex portion 16 of the resilient arm 14 and the recess 42 of the detachable device 40 are engaged with each other and the detachable device 40 is received and fastened within the receiving slot 32. In the embodiment, the sliding member 20 further includes a stopper portion 23 relative to the resilient arm 14 of the fixing member 10. While the sliding member 20 is in the first position relative to the fixing member 10, the stopper portion 23 prevents the resilient arm 14 from being displaced along the direction from the first surface 11 to the second surface 12. Thus, the convex portion 16 of the resilient arm 14 and the recess 42 of the detachable device 40 are kept to engage with each other, and the detachable device 40 is fastened firmly in the receiving slot 32. The assembling, positioning and the fastening of the detachable device 40 in the detachable assembling structure 1 are achieved.

It is noted that the first position, the second position and the third position of the sliding member 20 relative to the fixing member 10 can be for example but not limited to the linear displacement of the sliding member 20 relative to the fixing member 10 along the first direction or the second direction. For example, while the sliding member 20 is displaced relative to the fixing member 10 along the first direction, the position status is switched from the first position to the second position and then the third position sequentially. In the embodiment, the convex portion 16 of the resilient arm 14 includes an inclined plane 18 increasing protrusion along the first direction. While the detachable device 40 is detachably received within the receiving slot 32 along the first direction through the receiving opening 33, the detachable device 40 pushes against the inclined plane 18 gradually till the convex portion 16 of the resilient arm 14 maintains to push against the mounting surface 41. In addition, the sliding member 20 includes a first engaging portion 24 disposed on an end of the sliding member 20. The detachable device 40 includes a second engaging portion 43 disposed nearby an edge of the mounting surface 41 and relative to the first engaging portion 24. While the detachable device 40 is detachably received within the receiving slot 32 along the first direction through the receiving opening 33, the first engaging portion 24 and the second engaging portion 43 are engaged with each other. It facilitates the mounting surface 41 of the detachable device 40 to be aligned with the first surface 11 or be displaced with the fixing member 10 synchronously. Moreover, the sliding member 20 includes a protruding handle 25 disposed on another end of the sliding member 20 and configured to drive the sliding member 20 to slide with respect to the fixing member 10 along the first direction or the second direction. Thus, it facilitates the fixing member 10 to be displaced to switch the position status among the first position, the second position and the third position.

In an embodiment, the assembling, positioning and fastening operations of the detachable device 40 in the detachable assembling structure 1 can be achieved for example by displacing linearly the sliding member 20 relative to the fixing member 10 from the first position of in FIG. 2A, passing through the second position of FIG. 3A and then arriving to the third position of FIG. 4A. While the connection portion 44 of the detachable device 40 is slid into the receiving slot 32 along the first direction through the receiving opening 33, the front end of the mounting surface 41 of the detachable device 40 is contacted with the inclined plane 18 of the resilient arm 14 firstly, and then the inclined plane 18 of the resilient arm 14 is pushed by the second engaging portion 43 on the mounting surface 41 to drive the convex portion 16 to move along the direction from the first surface 11 to the second surface 12. While the sliding member 20 is located at the first position relative to the fixing member 10 as shown in FIGS. 2A and 2B, the switching columns 17 are away from the first ends of the pushing portions 21 and free of contacting with each other or pushing against each other. At the meantime, the convex portion 16 of the resilient arm 14 tends to restore the elastic force and push against the mounting surface 41. Thereafter, the mounting surface 41 of the detachable device 40 slides along the first direction. The second engaging portion 43 on the mounting surface 41 is engaged with the first engaging portion 24 of the sliding member 20 and drives the sliding member 20 to move relative to the fixing member 10 along the first direction. The pushing portions 21 push against the switching columns 17 to drive the switching columns 17 away from the second surface 12 and drive the convex portion 16 of the resilient arm 14 away from the first surface 11 along the direction from the first surface 11 to the second surface 12. Consequently, the convex portion 16 of the resilient arm 14 does not pass through the first surface 11. While the mounting surface 41 of the detachable device 40 is driven to slide along the first direction, the convex portion 16 of the resilient arm 14 doesn't push against the mounting surface 41. At the meantime, the sliding member 20 is located at the second position relative to the fixing member 10 as shown in FIGS. 3A and 3B. While the detachable device 40 is completely received within the receiving slot 32 and the connection portion 44 is connected to the connection socket 35 of the housing 30, the convex portion 16 of the resilient arm 14 is faced to the recess 42 on the mounting surface 41. Finally, the sliding member 20 is driven to move along the first direction to the third position by applying a force to the protruding handle 25. The sliding member 20 is located at the third position relative to the fixing member 10 as shown in FIG. 4A and FIG. 4B. At the meantime, the second ends of the pushing portions 21 are away from the switching columns 17 and free of contacting with each other or pushing against each other. The resilient arm 14 maintains to restore the elastic force so that the convex portion 16 and the recess 42 of the detachable device 40 are engaged with each other and the detachable device 40 is received and fastened in the receiving slot 32. Moreover, while the sliding member 20 is displaced linearly to the third position relative to the fixing member 10, the stopper portion 23 of the sliding member 20 is also slid to a position relative to the convex portion 16 of the resilient arm 14 so as to prevent the resilient arm 14 from being displaced along the direction from the first surface 11 to the second surface 12. Namely, the convex portion 16 of the resilient arm 14 and the recess 42 of the detachable device 40 maintain the engagement with each other. Consequently, the detachable device 40 is fastened firmly within the receiving slot 32 to achieve the assembling, positioning and fastening operations of the detachable device 40 within the detachable assembling structure 1. It is emphasized that the assembling, positioning and fastening operations of the detachable device 40 within the detachable assembling structure 1 can be for example but not limited to the linear displacing relationship among the first position, the second position and the third position of the sliding member 20 relative to the fixing member 10. In an embodiment, the installing position of stopper portion 23 can be variated to prevent the resilient arm 14 from being displaced along the direction from the first surface 11 to the second surface 12 while the sliding member 20 is located at the first position relative to the fixing member 10. Alternatively, in another embodiment, the forgoing third position can be regarded as the same status of the first position. For example, while the sliding member 20 is located at the second position relative to the fixing member 10, the pushing portions 21 push against the switching columns 17 and drive the switching columns 17 away the second surface 12. At the meantime, the convex portion 16 of the resilient arm 14 doesn't pass through the first surface 11, and the mounting surface 41 of the detachable device 40 can be slid along the first direction till the detachable device 40 is received in the receiving slot 32 completely. Furthermore, while the detachable device 40 is received in the receiving slot 32 completely and the connection portion 44 is connected to the connection socket 35 of the housing 30, the sliding member 20 can be driven to move along the first direction to the third position by applying the force to the protruding handle 25. Since the pushing portions 21 are away from the switching columns and free of contacting with each other or pushing against each other, the convex portion 16 of the resilient arm 14 and the recess 42 of the detachable device 40 are engaged with each other due to the restoring elastic force of the resilient arm 14. In addition, the stopper portion 23 of the sliding member 20 is also slid to a position relative to the convex portion 16 of the resilient arm 14 so as to prevent the resilient arm 14 from being displaced along the direction from the first surface 11 to the second surface 12. Consequently, the detachable device 40 is fastened firmly within the receiving slot 32. Certainly, in some embodiment, the assembling, positioning and fastening operations of the detachable device 40 can be achieved by sliding the sliding member 20 relative to the fixing member 10 and switching the position status between the first position and the second position. However, it is not redundantly described herein.

On the other hand, the above-described steps can be performed in reverse so as to achieve unfastening and disassembling of the detachable device 40. For example, in order to unfasten, the sliding member 20 is driven to displace linearly from the third position to the second position by applying the force to the protruding handle 25. Namely, the sliding member 20 is displaced linearly relative to the fixing member 10 from the third position as shown in FIG. 4A and FIG. 4B to the second position as shown in FIG. 3A and FIG. 3B. Thus, the unfastening operation is achieved. While the sliding member 20 is displaced linearly relative to the fixing member 10 from the second position as shown in FIG. 3A and FIG. 3B to the first position as shown in FIG. 2A and FIG. 2B, the first engaging portion 24 of the sliding member 20 and the second engaging portion 43 of the detachable device 40 are engaged with each other. Therefore, while the protruding handle 25 further drives the sliding member 20 to displace linearly along the second direction, the detachable device 40 is also driven to move along the second direction. It facilitates to disassemble the detachable device 40 from the receiving slot 32. Further for example, while the first engaging portion 24 of the sliding member 20 and the second engaging portion 43 of the detachable device 40 are engaged with each other and the protruding handle 25 drives the sliding member 20 to displace linearly along the second direction, the connection portion 44 of the detachable device 40 is driven to separate from the connection socket 35 of the housing 30. It has to be emphasized that the first engaging portion 24, the second engaging portion 43 and the stopper portion 23 can be omitted in some embodiments. It doesn't affect the linear displacing relationship among the first position, the second position and the third position, and doesn't affect the related operations of installing, positioning, latching, unlatching and disassembling either. It is not redundantly described herein.

Figure 5A:
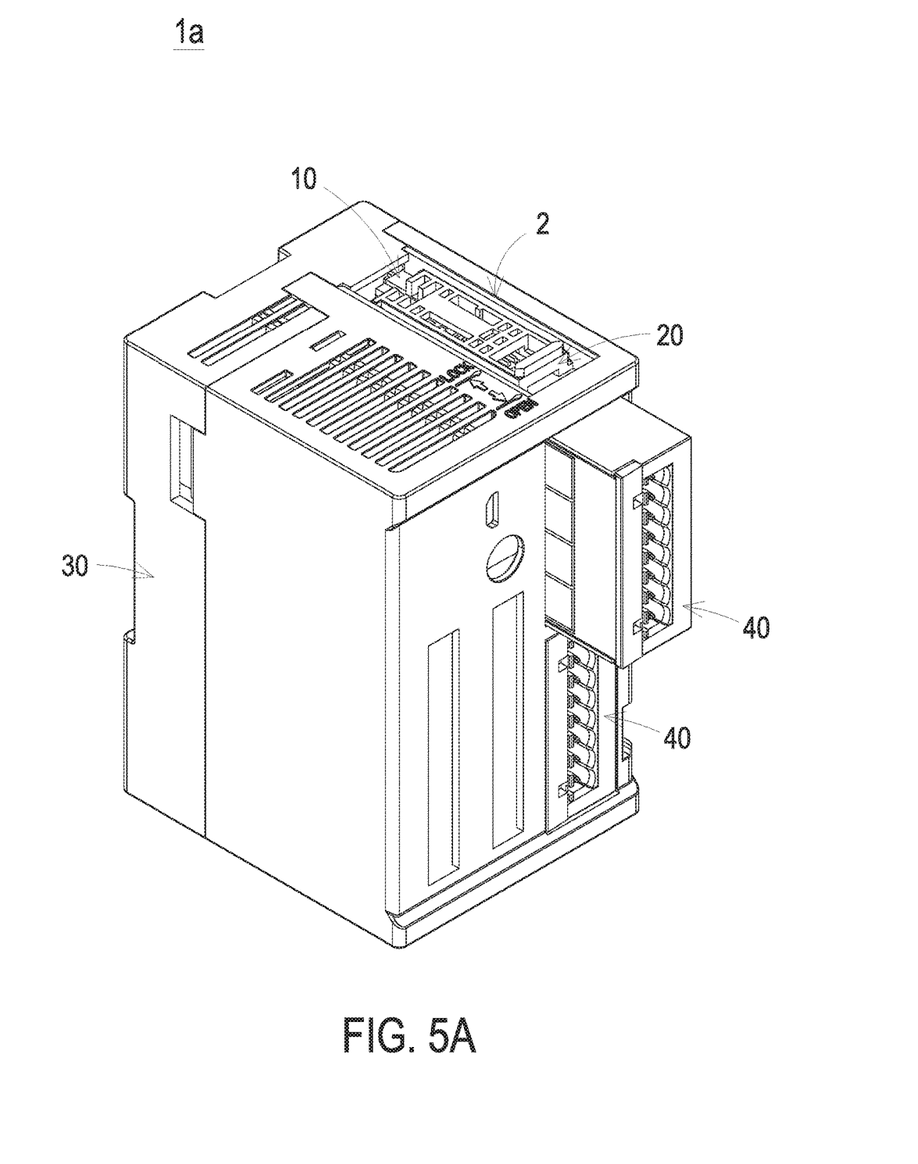
FIG. 5A is a perspective structural view illustrating a detachable assembling structure having a latch module according to a second preferred embodiment of the present invention.
Figure 5B:
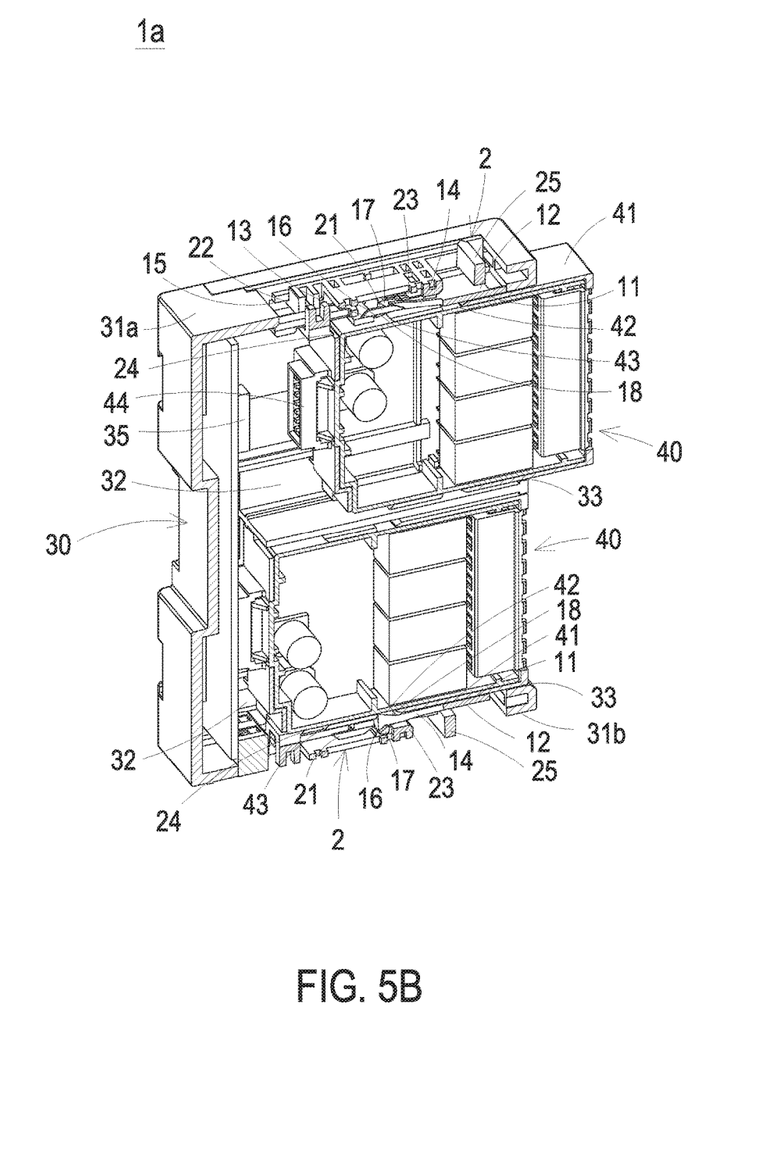
FIG. 5B shows a cross-sectional view of the detachable assembling structure having the latch module in FIG. 5A.

FIG. 5A is a perspective structural view illustrating a detachable assembling structure having a latch module according to a second preferred embodiment of the present invention. FIG. 5B shows a cross-sectional view of the detachable assembling structure having the latch module in FIG. 5A. In the embodiment, the structures, elements and functions of the detachable assembling structure 1a are similar to those of the detachable assembling structure 1 in FIGS. 1A to 4B, and are not redundantly described herein. Different from the detachable assembling structure 1, in the embodiment, the detachable assembling structure 1a further includes two latch modules 2 disposed on two opposite sides, which are the first side 31a and second side 31b. Each of the latch modules 2 is communicated with the receiving slot 32 and the receiving opening 33. In the embodiment, two detachable devices 40 can be installed, positioned, latched, unlatched and disassembled, respectively. Furthermore, two detachable devices 40 can be for example but not limited to the similar or different electronic devices. The types of the detachable devices 40 are not the essential feature to limit the present invention. It is noted that installation position of the latch modules 2 of the detachable assembling structure 1a and the positions and the numbers of the corresponding receiving slots 32, the corresponding receiving openings 33 and the corresponding detachable devices 40 are adjustable according the practical requirements. For example, in an embodiment, two latch modules 2 are disposed on two opposite sides, respectively and employed in the installing, positioning, latching, unlatching and disassembling operations of a single detachable device 40. It has to be emphasized that the latch module 2 of the present invention is not limited to be applied to an electronic apparatus. Any assembly structure applicable to the present invention can be incorporated herein as reference.

In summary, the present disclosure provides a latch module and a detachable assembling structure. By installing the two-piece latch module in a detachable assembly structure having a detachable electronic device, the installation, positioning, latching, unlatching and disassembling of the detachable electronic device are achieved in different relative positions of a linear sliding displacement operation. Since the latch module adopts linear sliding operation, its structure is simplified, the operation is easy, and the miniaturization of the overall structure is facilitated. Moreover, through the linear displacement of the two-piece latch module, the detachable electronic device can be mounted on the main structure, and the functions of the positioning and fastening can be achieved. Consequently, it prevents the detachable electronic device from breaking away the main structure due to the accidental collision, and ensures the firm connection of the detachable electronic device and the main structure.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A latch module, comprising:
a fixing member comprising a first surface, a second surface, an opening, a resilient arm and a guiding unit, wherein the first surface and the second surface are opposite to each other, and the first surface is configured to align and attach to a mounting surface of a detachable device, wherein the opening passes through the first surface and the second surface, and the resilient arm is received within the opening and comprises a first end connected with an edge of the opening and a second end opposite to the first end, wherein the resilient arm comprises a convex portion and at least one switching column, wherein the convex portion is disposed on the second end of the resilient arm, located at a first side of the opening and protrudes along a direction from the second surface to the first surface, wherein while the mounting surface is attached to the first surface, the convex portion tends to push against the mounting surface, wherein the at least one switching column is relative to the convex portion and located at a second side of the opening, wherein the guiding unit is disposed on two lateral sides of the fixing member; and
a sliding member comprising at least one pushing portion and a sliding unit, wherein the sliding unit is disposed on two lateral sides of the sliding member and configured with and relative to the guiding unit of the fixing member so that the sliding member slides linearly with respect to the fixing member along a first direction or a second direction, wherein the first direction and the second direction are opposite to each other, wherein while the sliding member is in a first position relative to the fixing member, the at least one switching column is separated from an end of the at least one pushing portion and the resilient arm maintains an elastic force, wherein while the sliding member is in a second position relative to the fixing member, the at least one pushing portion pushes against the at least one switching column to drive the at least one switching column away from the second surface and drive the convex portion of the resilient arm away from the first surface along a direction from the first surface to the second surface.

2. The latch module according to claim 1, wherein the latch module is constructed on a housing, wherein the detachable device is detachably connected to the housing along the first direction, and the detachable device is detached from the housing along the second direction.

3. The latch module according to claim 2, wherein the sliding member comprises a first engaging portion disposed on an end of the sliding member, wherein the detachable device comprises a second engaging portion disposed nearby an edge of the mounting surface and relative to the first engaging portion, wherein while the detachable device is detachably connected to the housing along the first direction, the first engaging portion and the second engaging portion are engaged with each other.

4. The latch module according to claim 2, wherein while the sliding member is in a third position relative to the fixing member, the at least one switching column is separated from another end of the at least one pushing portion, the convex portion of the resilient arm is engaged with a recess of the detachable device, wherein the detachable device is connected and fastened within the housing.

5. The latch module according to claim 4, wherein the slide number comprises a stopper portion relative to the resilient arm, wherein while the sliding member is in the third position relative to the fixing member, the stopper portion prevents the resilient arm from being displaced along the direction from the first surface to the second surface.

6. The latch module according to claim 1 wherein the slide number comprises a stopper portion relative to the resilient arm, wherein while the sliding member is in the first position relative to the fixing member, the stopper portion prevents the resilient arm from being displaced along the direction from the first surface to the second surface.

7. The latch module according to claim 1, wherein the detachable device comprises a recess disposed on the mounting surface and relative to the convex portion, wherein while the mounting surface is attached to the first surface and the convex portion tends to push against the mounting surface, the convex portion and the recess are engaged with each other.

8. The latch module according to claim 1, wherein the convex portion comprises an inclined plane increasing protrusion along the first direction, wherein while the detachable device is detachably connected to the housing along the first direction, the detachable device pushes against the inclined plane and the convex portion tends to push against the mounting surface.

9. The latch module according to claim 1, wherein the guiding unit and the sliding unit are a concave rail and a convex rail, respectively.

10. The latch module according to claim 1, wherein the at least one switching column comprises two switching columns disposed on two lateral sides of the resilient arm, respectively, wherein the at least one pushing portion comprises two protruding rails disposed nearby the sliding unit and relative to the two switching columns, respectively, wherein while the sliding member is in the second position relative to the fixing member, the two protruding rails push against the two switching columns to drive the two switching columns away from the second surface and the convex portion of the resilient arm away from the first surface along the direction from the first surface to the second surface.

11. The latch module according to claim 1, wherein the sliding member comprises a protruding handle disposed on an end of the sliding member and configured to drive the sliding member to slide with respect to the fixing member along the first direction or the second direction.

12. A detachable assembling structure comprising:
a housing comprising at least one lateral side, at least one receiving slot and at least one receiving opening;
at least one detachable device, wherein the detachable device is configured to be detachably received within the receiving slot along a first direction through the receiving opening, or separated from the receiving slot along a second direction through the receiving opening, wherein the first direction and the second direction are opposite to each other, wherein the detachable device comprises at least one mounting surface and at least one recess, and the recess is disposed on the mounting surface; and
a latch module passing through the lateral side of the housing and comprising:
a fixing member comprising a first surface, a second surface, an opening, a resilient arm and a guiding unit, wherein the first surface and the second surface are opposite to each other, and the first surface is communicated with the receiving slot, wherein while the detachable device is received within the receiving slot, the first surface and the mounting surface are attached to each other, wherein the opening passes through the first surface and the second surface, and the resilient arm is received within the opening and comprises a first end connected with an edge of the opening and a second end opposite to the first end, wherein the resilient arm comprises a convex portion and at least one switching column, wherein the convex portion is disposed on the second end of the resilient arm, located at a first side of the opening and protrudes along a direction from the second surface to the first surface, wherein while the mounting surface is attached to the first surface, the convex portion tends to push against the mounting surface, wherein the at least one switching column is relative to the convex portion and located at a second side of the opening, wherein the guiding unit is disposed on two lateral sides of the fixing member; and
a sliding member comprising at least one pushing portion and a sliding unit, wherein the sliding unit is disposed on two lateral sides of the sliding member and configured with and relative to the guiding unit of the fixing member so that the sliding member slides linearly with respect to the fixing member along a first direction or a second direction, wherein while the sliding member is in a first position relative to the fixing member, the at least one switching column is separated from an end of the at least one pushing portion and the resilient arm maintains an elastic force, wherein while the sliding member is in a second position relative to the fixing member, the at least one pushing portion pushes against the at least one switching column to drive the at least one switching column away from the second surface and drive the convex portion of the resilient arm away the first surface along a direction from the first surface to the second surface.

13. The detachable assembling structure according to claim 12, wherein the convex portion of the resilient arm comprises an inclined plane increasing protrusion along the first direction, wherein while the detachable device is detachably received within the receiving slot along the first direction through the receiving opening, the detachable device pushes against the inclined plane and the convex portion tends to push against the mounting surface.

14. The detachable assembling structure according to claim 12, wherein the guiding unit and the sliding unit are a concave rail and a convex rail, respectively.

15. The detachable assembling structure according to claim 12, wherein the at least one switching column comprises two switching columns disposed on two lateral sides of the resilient arm, respectively, wherein the at least one pushing portion comprises two protruding rails disposed nearby the sliding unit and relative to the two switching columns, respectively, wherein while the sliding member is in the second position relative to the fixing member, the two protruding rails push against the two switching columns to drive the two switching columns away from the second surface and the convex portion of the resilient arm away from the first surface along the direction from the first surface to the second surface.

16. The detachable assembling structure according to claim 12, wherein while the sliding member is in a third position relative to the fixing member, the at least one switching column is separated from another end of the at least one pushing portion, the convex portion of the resilient arm is engaged with a recess of the detachable device, wherein the detachable device is received within the receiving slot.

17. The detachable assembling structure according to claim 16, wherein the slide number comprises a stopper portion relative to the resilient arm, wherein while the sliding member is in the third position relative to the fixing member, the stopper portion prevents the resilient arm from being displaced along the direction from the first surface to the second surface.

18. The detachable assembling structure according to claim 12, wherein the slide number comprises a stopper portion relative to the resilient arm, wherein while the sliding member is in the first position relative to the fixing member, the stopper portion prevents the resilient arm from being displaced along the direction from the first surface to the second surface.

19. The detachable assembling structure according to claim 12, wherein the sliding member comprises a protruding handle disposed on an end of the sliding member and configured to drive the sliding member to slide with respect to the fixing member along the first direction or the second direction.

20. The detachable assembling structure according to claim 12, wherein the sliding member comprises a first engaging portion disposed on an end of the sliding member, wherein the detachable device comprises a second engaging portion disposed nearby an edge of the mounting surface and relative to the first engaging portion, wherein while the detachable device is detachably received within the receiving slot along the first direction through the receiving opening, the first engaging portion and the second engaging portion are engaged with each other.

\* \* \* \* \*